United States Patent [19]

Desu et al.

[11] Patent Number: 5,431,958
[45] Date of Patent: Jul. 11, 1995

[54] METALORGANIC CHEMICAL VAPOR DEPOSITION OF FERROELECTRIC THIN FILMS

[75] Inventors: Seshu B. Desu; Chien-Hsiung Peng, both of Blacksburg, Va.

[73] Assignees: Sharp Kabushiki Kaisha, Osaka, Japan; Virginia Polytechnic Institute and State University, Blacksburg, Va.; Ceram, Inc., Colorado Springs, Colo.

[21] Appl. No.: 999,738

[22] Filed: Dec. 31, 1992

Related U.S. Application Data

[63] Continuation-in-part of Ser. No. 848,389, Mar. 9, 1992, abandoned.

[51] Int. Cl.$^6$ .............................................. C23C 16/40
[52] U.S. Cl. ....................... 427/255.3; 427/255.1; 427/255.2; 427/126.3
[58] Field of Search ............... 427/255.3, 255.1, 255.2, 427/248.1, 126.3

[56] References Cited

U.S. PATENT DOCUMENTS

| | | | |
|---|---|---|---|
| 5,006,363 | 4/1992 | Fujii et al. | 427/126.3 |
| 5,104,690 | 4/1992 | Greenwald | 427/126.3 |
| 5,204,314 | 4/1993 | Kirlin et al. | 427/126.3 |

OTHER PUBLICATIONS

Sakashita et al., "Preparation and Electrical Properties of MOCVD-deposited PZT thin films", J. Appl. Phys. 69(12) Jun. 1991, pp. 8352-8357.

Primary Examiner—Roy V. King
Attorney, Agent, or Firm—Beaton & Folsom

[57] ABSTRACT

A method to produce high quality doped and undoped lead zirconate titanate (PZT) thin films by metalorganic chemical vapor deposition is disclosed. The PZT thin films with the perovskite structure were deposited on sapphire disks, Pt/Ti/SiO$_2$/Si wafers, and RuO$_x$/SiO$_2$/Si wafers by both hot-wall and cold-wall CVD reactors at deposition temperature as low as 550° C. and a reduced pressure 6 torr. The source materials include metalorganic precursors and oxidizing agent. The metalorganic precursors can be metal alkoxides, metal acetylacetonates, or metal $\beta$-diketonates. Preferably, the precursors are lead tetramethylheptadione for Pb component, zirconium tetramethylheptadione for Zr component, and titanium ethoxide for Ti component and the oxidizing agent is oxygen. The stoichiometry of the films can be easily controlled by varying the individual precursor temperature and/or the flow rate of the carrier gas. The Pb(Zr$_{0.82}$Ti$_{0.18}$)O$_3$ film produced by the present invention shows a spontaneous polarization of 23.3 $\mu$C/cm$^2$, a remanent polarization of 12.3 $\mu$C/cm$^2$, and coercive field of 64.5 kV/cm.

9 Claims, 13 Drawing Sheets

METALORGANIC CHEMICAL VAPOR DEPOSITION OF FERROELECTRIC THIN FILMS

This application is a continuation-in-part of application Ser. No. 07/848,389, filed Mar. 9, 1992, now abandoned.

BACKGROUND OF THE INVENTION

1. Field of the Invention

The present invention relates in general to an improved metalorganic chemical vapor deposition (MOCVD) of ferroelectric thin films such as doped and undoped $Pb(Zr_xTi_{1-x})O_3$ thin films using safe and stable precursors, e.g. lead tetramethylheptadione, zirconium tetramethylheptadione, and titanium ethoxide.

2. The Prior Art

The lead zirconate titanate [$Pb(Zr_xTi_{1-x})O_3$ or PZT] ceramics are well known materials with the perovskite structure which have useful ferroelectric and electro-optic properties. Recent studies showed that PZT materials offer high permittivity for capacitors, large spontaneous polarization for nonvolatile memory devices, large electromechanical coupling coefficient for surface acoustic wave (SAW) applications, and good optical properties for electro-optic devices.

A variety of techniques have been used for the deposition of ferroelectric thin films. In general, the thin film deposition techniques can be divided into two major categories; i.e., (1) physical vapor deposition (PVD) and (2) chemical processes. Among the PVD techniques, the most common methods used for the deposition of ferroelectric thin films are electron beam evaporation, rf diode sputtering, rf magnetron sputtering, dc magnetron sputtering, ion beam sputtering, molecular beam epitaxy (MBE), and laser ablation, see Oikawa et al., "Preparation of Pb(Zr,Ti)O$_3$ thin films by an electron beam evaporation technique," *Appl. Phys. Lett.*, 29(8), 491 (1976), Okada et al., "Some electrical and optical properties of ferroelectric lead-zirconate-lead-titanate thin films," *J. Appl. Phys.*, 48(7), 2905 (1977), Takayama et al., "Preparation of epitaxial $Pb(Zr_xTi_{1-x})O_3$ thin films and their crystallographic, pyroelectric, and ferroelectric properties," *J. Appl. Phys.*, 65(4), 1666 (1989), Sreenivas et al., "Surface acoustic wave propagation on lead zirconate titanate thin films," *Appl. Phys. Lett.*, 52(9), 709 (1988), and Ramesh et al., "Ferroelectric $Pb(Zr_{0.2}Ti_{0.8})O_3$ thin films on epitaxial Y—Ba—Cu—O," *Appl. Phys. Lett.*, 59(27), 3542 (1991). The chemical processes can be further divided into two subgroups; i.e., the chemical vapor deposition (CVD) and the wet chemical process including sol-gel process and metalorganic decomposition (MOD). The first successful PZT films were produced by PVD techniques (e-beam evaporation and rf diode sputtering) in 1976, then followed by MOD process and sol-gel technique in mid 1980s, see Fukushima et al., "Preparation of ferroelectric PZT films by thermal decomposition of organometallic compounds," *J. Mater. Sci.*, 19, 595 (1984) and Yi et al., "Preparation of Pb(Zr,Ti)O$_3$ thin films by sol-gel processing: electrical, optical, and electro-optic properties," *J. Appl. Phys.*, 64(5), 2717 (1988). The laser ablation and metalorganic chemical vapor deposition (MOCVD) PZT films did not appear until the beginning of the 1990s, see Sakashita et al., "Preparation and electrical properties of MOCVD-deposited PZT thin films," *J. Appl. Phys.*, 69(12), 8352 (1991) and Peng et al., "Low temperature metalorganic chemical vapor deposition of perovskite $Pb(Zr_xTi_{1-x})O_3$ thin films," *Appl. Phys. Lett.*, 61(1), 16 (1992). The PVD techniques require a high vacuum, usually better than $10^{-5}$ torr, in order to obtain a sufficient flux of atoms or ions capable of depositing onto a substrate. The advantages of the PVD techniques are (1) dry processing, (2) high purity and cleanliness, and (3) compatibility with semiconductor integrated circuit processing. However, these are offset by disadvantages such as (1) low throughput, (2) low deposition rate, (3) difficult stoichiometry control, (4) high temperature post deposition annealing, and (5) high equipment cost. Laser ablation is a newly developed thin film deposition technique and the understanding of this process is in its infant period. Laser ablation has found some success in depositing high temperature superconducting films. There are only a few reported works on laser deposition of PZT films. The major problem of this technique are the composition and thickness nonuniformity of the deposited films over a large scale.

The wet chemical processes includes MOD and sol-gel process. The advantages of the wet chemical process are: (1) molecular homogeneity, (2) high deposition rate and high throughput, (3) excellent composition control, (4) easy introduction of dopants, and (5) low capital cost; deposition can be done in ambient condition, no vacuum processing is needed. The major problems due to this wet process are (1) film cracking during the post-annealing process and (2) possible contamination which results in a difficulty to incorporate this technique into the semiconductor processing. However, because it provides a fast and easy way to produce the complex oxide thin films, this wet chemical process acts a very important role in the investigation of the interrelationship among the processing, the microstructure, and the property of the films.

Of all the above mentioned techniques, the MOCVD technique appears to be the most promising because it offers advantages of simplified apparatus, excellent film uniformity, composition control, high film densities, high deposition rates, excellent step coverage, and amenability to the large scale processing. The excellent film step coverage that can be obtained by MOCVD cannot be equaled by any other technique. Purity, controllability, and precision that have been demonstrated by MOCVD are competitive with the MBE technique. More importantly, novel structures can be grown easily and precisely. MOCVD is capable of producing materials for an entire class of devices which utilize either ultra-thin layers or atomically sharp interfaces. In addition, different compositions, for example $Pb(Zr_xTi_{1-x})O_3$, can be fabricated using the same sources.

The first successful deposition of oxide-based ferroelectric thin films by CVD was reported by Nakagawa et al. in "Preparation of PbTiO$_3$ ferroelectric thin film by chemical vapor deposition," *Jpn. J. Appl. Phys.*, 21(10), L655 (1982). They deposited PbTiO$_3$ films on Pt-coated silicon wafers by using TiCl$_4$, PbCl$_2$, O$_2$, and H$_2$O as source materials. Several problems arose from their studies: (1) very high evaporation temperature (700° C.) was required of PbCl$_2$, (2) poor ferroelectric properties ($P_r = 0.16$ $\mu C/cm^2$ and $E_c = 14.5$ kV/cm), (3) poor composition uniformity in the bulk of PbTiO$_3$ films, and (4) crystallographic imperfections due to water and/or chloride contamination. Obviously, chlorides are not ideal precursors for the CVD process. In general, metalorganic precursors have relatively high vapor pressures at lower temperatures. By carefully selecting the organic compounds, the undesirable contaminations in the films can be completely excluded. Metalorganic compounds are now used almost exclusively for the deposition of oxide thin films. During the past few years, five other research groups sequentially published the results of MOCVD PZT films. However, the reported MOCVD PZT films were fabricated at relatively high temperatures (>600° C.) using cold wall type reactors. Cold-wall reactors are good for epitaxial films because of less particle contamination. However, cold-wall reactors suffer from their low throughput. In contrast, hot-wall reactors are conceptually simpler because of the isothermal environment. In addition, they offer much higher throughput than do cold-wall reactors. But hot-wall reactors suffer from particle contaminations from the walls of the chamber. This may not be a severe problem for polycrystalline films. Furthermore, low temperature deposition processes are needed to integrate ferroelectrics into semiconductor processing.

Greenwald, U.S. Pat. No. 5,104,690 granted Apr. 14, 1992, described the art of manufacturing PZT films by CVD. However, Greenwald failed to demonstrate the composition control, the structure property, and the ferroelectric properties of the resulting films. In addition, Greenwald utilized an extremely toxic precursor material, i.e. tetraethyl lead, for the lead component. Also, Greenwald did not show what deposition temperatures he used to obtain PZT films.

SUMMARY OF THE INVENTION

It is an object of the present invention to provide a reliable metalorganic chemical vapor deposition process of making high quality of both doped and undoped $Pb(Zr_xTi_{1-x})O_3$ thin films which are useful in the applications of capacitors, nonvolatile memory devices, pyroelectric infrared sensors, optical displays, optical switches, piezoelectric transducers, and surface acoustic wave devices. Preferably, the source materials are lead tetramethylheptadione ($Pb(thd)_2$), zirconium tetramethylheptadione ($Zr(thd)_4$), titanium ethoxide, and oxygen. Preferably, the substrates are Pt-coated silicon wafers (Pt/Ti/SiO$_2$/Si), RuO$_x$-coated silicon wafers (RuO$_x$/SiO$_2$/Si), or sapphire. Preferably, the dopant is lanthanum, neodymium, niobium, or yttrium.

DETAILED DESCRIPTION OF THE PREFERRED EMBODIMENTS

The selection of the precursors is most critical step in CVD for successful depositions of complex oxide thin films. The ideal precursors for MOCVD have to meet the following requirements:

(1) High vapor pressure at low vaporization temperature.
(2) Low decomposition temperature.
(3) Large enough temperature "window" between vaporization and decomposition temperatures.
(4) No contaminations from the organic constituents of the precursors
(5) Stable under ambient conditions.
(6) Nontoxic.

It is one of the goals in this invention to identify the ideal precursors for MOCVD PZT films.

Several types of metalorganic compounds have been commonly used as precursors to grow metal oxide thin films including metal alkyls, metal alkoxides, and metal β-diketonates. Metal alkyls have the general formula $M^{n+}R_n$ where $R=C_mH_{2m+1}$, metal alkoxides have the general formula $M^{n+}(OR)_n$, and metal β-diketonates have the general where R=alkyl or fluoroalkyl group. Most of the metalorganic precursors have reasonable vapor pressures at relative low temperatures. Although metal alkoxides and metal β-diketonates tend to be less volatile than their alkyl equivalents, they are easier to handle and are much less toxic. One of the assets of metalorganic precursors is that their physical and chemical properties can be tailored by making small changes in their chemical structure. For example, the volatility of a metal β-diketonate can be increased by varying the R-group on the chelating ring. In general, increased bulkiness of the R-group or increased fluorine substitution on the R-group increases volatility. For example, the volatility increases with chelates of increased fluorination: lead bis-acetylacetonate < lead bis-trifluoroacetylacetonate < lead bis-hexafluoroacetylacetonate and increased bulkiness: lead bis-acetylacetonate < lead bis-dimethylheptadione < lead bis-tetramethylheptadione. Increasing the size of the ligand increases the metal chelate volatility by shielding the metal center from molecular interactions. Fluorination has the same effect because fluorine atoms are somewhat larger than the hydrogen atoms for which they substitute. The thermal and ambient stabilities of the metal β-diketonate are also sensitive to variation in the R-substituent and metal ion size. Effective shielding of the metal ion due to either small ion size or bulkiness of the ligand results in increased thermal and ambient stability. This effect can be explained in the same manner in which the increased volatility of the β-diketonate is explained. Increased shielding of the metal center renders the compound less prone to intermolecular reactions which form oligomers, and also less prone to reactions with water or oxygen to increase the coordination number. In the case of metal alkoxides, their vapor pressures strongly depend on the nature of the organic group, R. In general, the vapor pressure increases as the molecular mass of R decreases. However, if R is too small, the alkoxide groups no longer shield the incompletely coordinated central metal ion and the molecule tends to oligomerise. This leads to an increased molecular weight and thus to a reduction of the vapor pressure. For the alkoxides, the vapor pressure also depends on the branching of R. The higher the branching, the more effective the shielding of the metal ion. In the case of the butoxides of Ti and Zr, this leads to a substantial increase of the vapor pressure going from the n-butoxide, to iso-butoxide to tertiary-butoxide.

Use of lead bis-hexafluoroacetylacetonate and lead bis-heptaflurodimethyloctadione [Pb(fod)$_2$] resulted in fluorine contamination in the films. In addition, PbO formation from thermal decomposition of Pb(fod)$_2$ is initiated at 300° C., but PbF$_2$ becomes the dominant phase above 300° C. On the other hand, although good quality PbO films were obtained from tetraethyl lead (TEL), the extremely toxic nature of this precursor may prevent its use in large scale applications. Additionally, lead alkyls are photosensitive, and decompose by free radical decay. Lead alkoxides, for example lead t-butoxide, are also liquids at room temperature, and possess significant vapor pressures which creates toxicity problems. In addition, the large Pb(II) ion suffers the hydrolysis problem which is typical of metal alkoxides.

Several difficulties were encountered in using zirconium acetylacetonate [Zr(acac)$_4$] and zirconium trifluoroacetylacetonate [Zr(tfa)$_4$] precursors. For example, Zr(acac)$_4$ resulted in cubic ZrO$_2$ films with carbon contamination up to 15 atom %. Changes in the gas composition when using Zr(tfa)$_4$ resulted in fluorine contamination in the films. The fluorine contamination problem can be solved by controlling the partial pressure of water vapor in the reactor during deposition. One of the problems in the use of the zirconium alkoxides, e.g. zirconium isopropoxide and zirconium t-butoxide, is that they are very sensitive to air. Zirconium tetramethylheptadione is thermally stable over its vaporization temperature range, and is very easy to handle under ambient conditions. It has been proven to be a suitable precursor for the CVD process despite its relatively high vaporization temperature (180° C.–230° C.) and decomposition temperature (500° C.–550° C.). Since the formation temperature of the perovskite phase of the PZT film is around 550° C., the high decomposition temperature of Zr(thd)$_4$ is not a severe problem. Titanium alkoxides have been used as precursors for TiO$_2$ thin film deposition without significant disadvantages. They are reasonably stable under ambient conditions, and do not present any extreme health hazards. The difference in degree of moisture sensitivity of the titanium alkoxides and zirconium alkoxides is a function of the metal atom size. Both are d° metals in the (IV) oxidation state, and are very electronegative. The smaller Ti$^{4+}$ion is somewhat shielded from atmospheric moisture by its organic ligands, but the larger Zr$^{4+}$ion is not completely shielded by its ligands, and reacts with atmospheric moisture.

Figure 1:
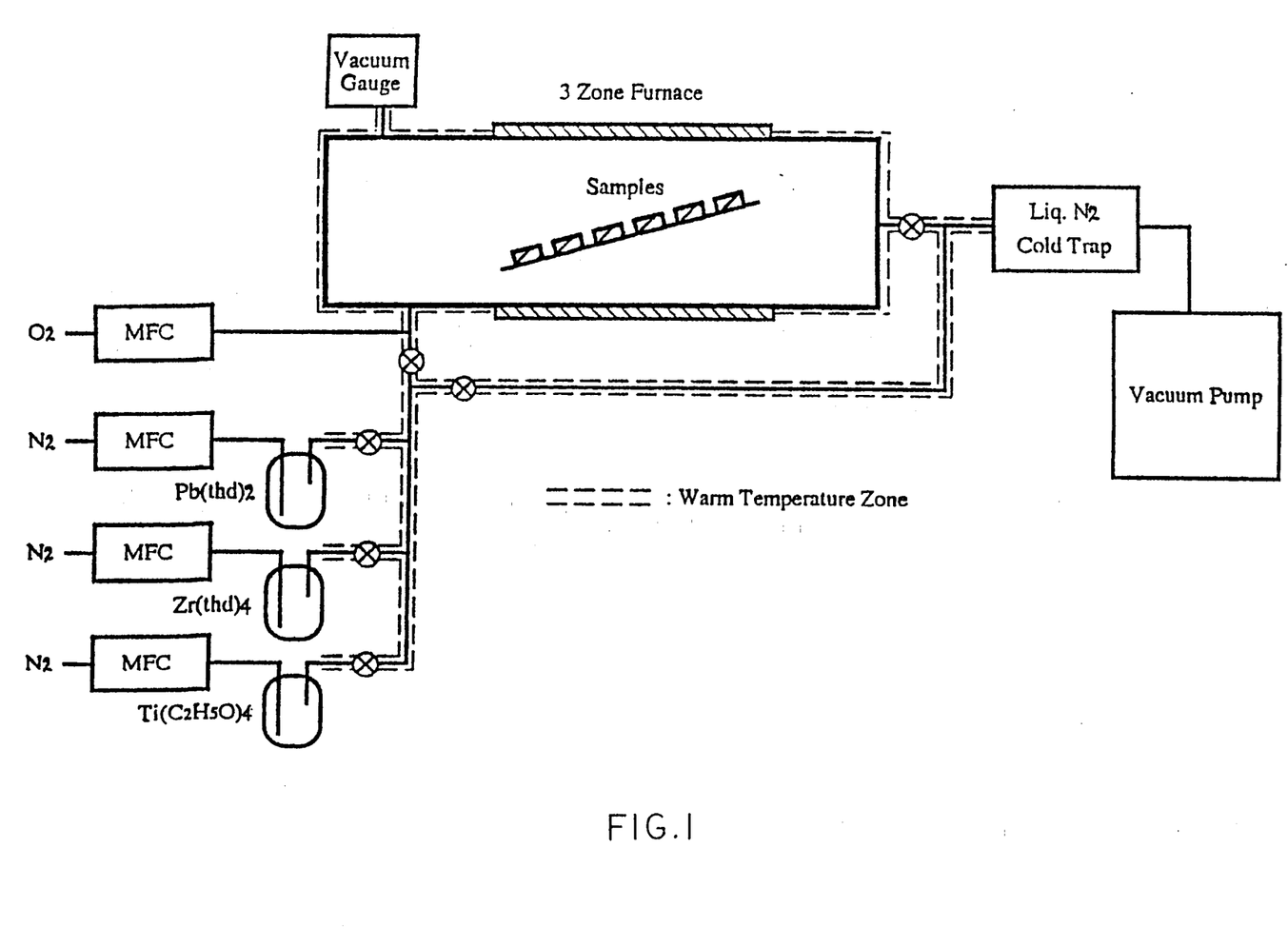
FIG. 1 is a schematic diagram of hot wall MOCVD apparatus used in this invention.

After intensive studies searching for the most suitable compromise of precursors for MOCVD PZT thin films, the suggested combination is as follows:

(1) For PbO: lead tetramethylheptadione.
(2) For ZrO$_2$: zirconium tetramethylheptadione.
(3) For TiO$_2$: titanium ethoxide or titanium isopropoxide. A schematic diagram of the hot-wall CVD apparatus used in this invention is shown in FIG. 1. The reaction chamber is a stainless steel tube having 80 mm inside diameter. The temperature is maintained by a resistively heated three-zone furnace. Low pressures are achieved by a mechanical pump. The pressure is monitored by an MKS BARATRON pressure sensor with a range of 12 to 10$^{-3}$ torr. A cold trap filled with liquid nitrogen is installed between the reaction chamber and the mechanical pump to condense the products and/or the unreacted reagents. The precursor material is packaged in a stainless steel bubbler which has two connectors; one is connected to the reactor by a stainless steel line with a manual valve and the other is connected to a N$_2$ gas cylinder with a mass flow controller. Aluminum housed mantle heaters with temperature controllers are used to control the temperatures of the precursors. The precursors were kept at the desired temperatures within ±0.5° C. during deposition. The paths between the furnace and the precursor bubblers were heated by heating tapes to a temperature ranging from 200° C. to 250° C.; this prevents the precursors from either condensing or decomposing.

Figure 2:
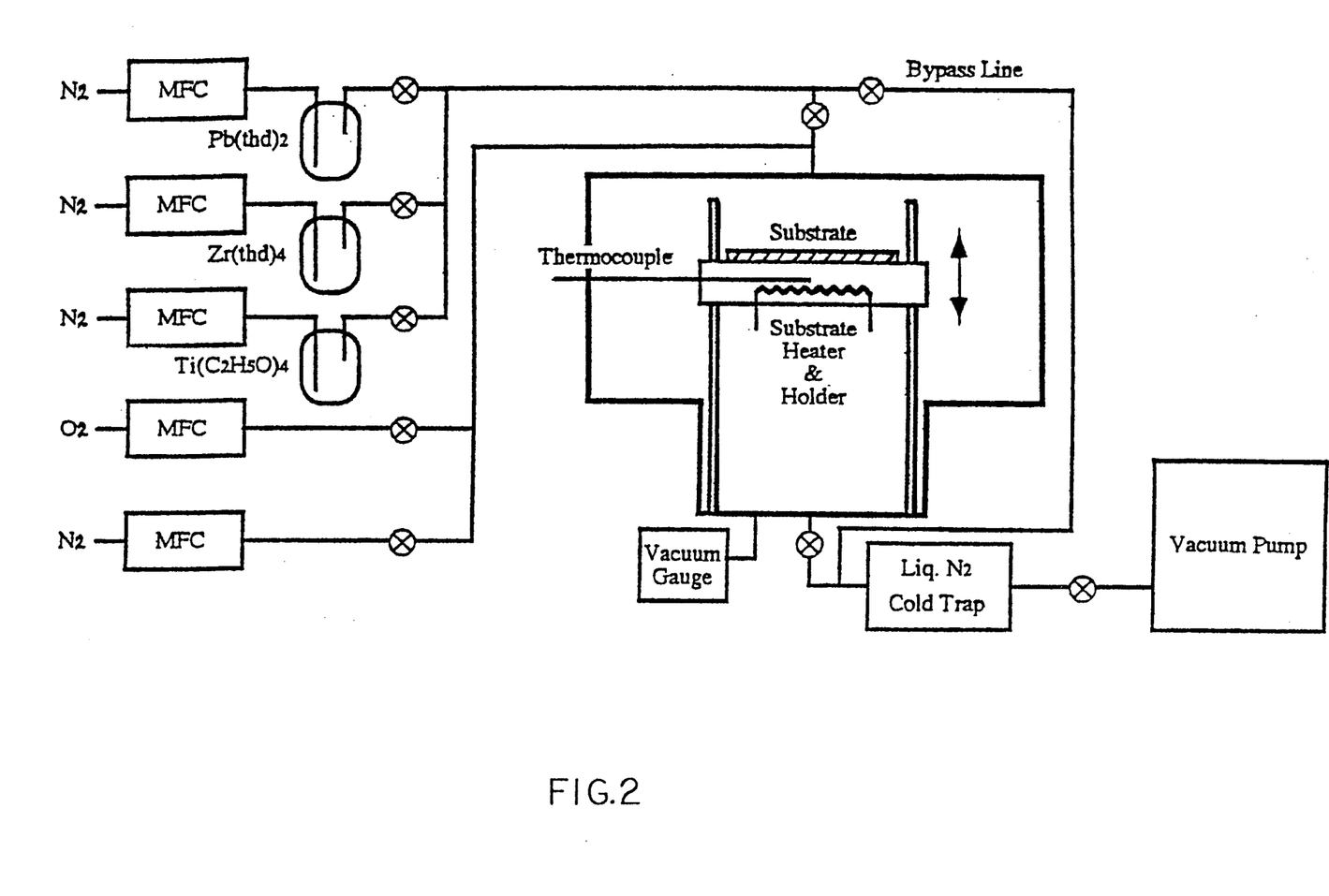
FIG. 2 is a schematic diagram of cold wall MOCVD apparatus used in this invention.

A schematic diagram of the cold-wall MOCVD apparatus used in this invention is shown in FIG. 2. The cold-wall reactor differs from the hot-wall reactor in that (1) only the substrates are heated, (2) the source vapors are vertically injected onto the substrates, and (3) the wall of the deposition chamber is kept around 250° C. A three inch diameter substrate heater was employed, which can be operated at a maximum temperature of 900° C. The temperature of the substrate heater is position insensitive within an 8° C. range, and the variation in temperature with time is within 1° C. A substrate holder, which was made of INCONEL and was placed in direct contact with the substrate heater, was used to hold the substrates. The substrate temperature was monitored by a thermocouple which was directly placed inside the center of the substrate holder. The specimens were adhered on the substrate holder by silver paste. The silver paste was used to improve the heat conduction and the temperature uniformity of the specimens. The distance between the inlet of the source mixture and the substrates can be varied from 1.5 to 10 cm. The setup and the control of the bypass line and the bubbler heaters are similar to those of the hot-wall apparatus. The bubblers used in present invention have a cylindrical shape 1.5 inches in diameter and 6 inches high. A volume of 40 cm$^3$ titanium ethoxide packaged in the bubbler can be used for more than 20 depositions.

After each deposition this liquid source was kept in vacuum. In this manner, titanium ethoxide can last for at least one month without apparent degradation. On the other hand, 0.8 g each of fresh lead tetramethylheptadione and zirconium tetramethylheptadione were used for each deposition. All of these precursors are stable and safe in air at room temperature. For the deposition of PZT films, substrates were loaded, the reactor chamber was sealed, and the system was evacuated to 0.01 torr. The reaction chamber was then heated to desired temperature, e.g. 550° C., and the source bubblers were also heated to desired temperatures. At the beginning of the deposition, the source vapors accompanied with nitrogen carrier gas were flowed through the bypass line; oxygen was flowed through the deposition chamber to minimize the back diffusion of source vapors into the chamber. This bypass process was continued for about 3 minutes before beginning the deposition process. After the bypass process, the bypass valve was closed and the main valve of the reaction chamber was opened to start the deposition. At the end of the run the evaporators and diluent gas were shut off, and the reactor was evacuated to base pressure before backfilling with air to atmospheric pressure. The samples were furnace-cooled below 100° C. before they were removed from the reactor.

EXAMPLE 1

The ferroelectric $Pb(Zr_xTi_{1-x})O_3$ thin films were deposited on sapphire disks, $Pt/Ti/SiO_2/Si$ wafers, and $RuO_x/SiO_2/Si$ wafers by a hot wall MOCVD reactor with the following parameters:

Substrate temperature: 550° C.

Precursor, precursor temperature, and carrier gas: lead tetramethylheptadione $(Pb(C_{11}H_{19}O_2)_2)$, 145°–165° C., 20–30 sccm $N_2$ zirconium tetramethylheptadione $(Zr(C_{11}H_{19}O_2)_4)$, 200°–230° C., 15–30 sccm $N_2$ titanium ethoxide $(Ti(OC_2H_5)_4)$, 80°–115° C., 5 sccm $N_2$ Oxidizing agent: oxygen, 500–1000 sccm. Chamber pressure: 6 torr.

Figure 3A:
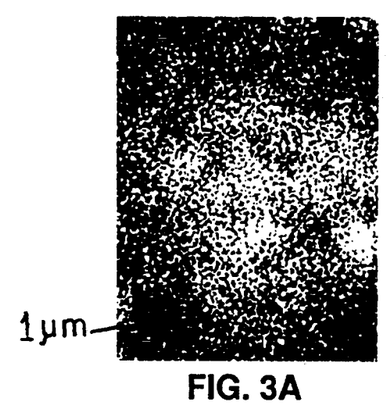
FIG. 3 is SEM micrographs of MOCVD PZT films: (A) as-deposited $Pb(Zr_{0.4}Ti_{0.6})O_3$ film on sapphire substrate, (B) as-deposited $Pb(Zr_{0.6}Ti_{0.4})O_3$ film on Pt/Ti/SiO$_2$/Si substrate, (C) as-deposited $Pb(Zr_{0.8}Ti_{0.2})O_3$ film on RuO$_x$/SiO$_2$/Si substrate, and (D) 650° C./30 min. annealed $Pb(Zr_{0.8}Ti_{0.2})O_3$ film on RuO$_x$/SiO$_2$/Si substrate.
Figure 3B:
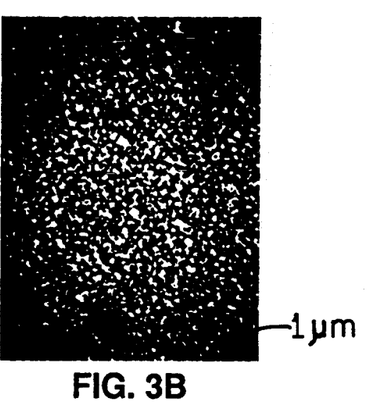
Figure 3C:
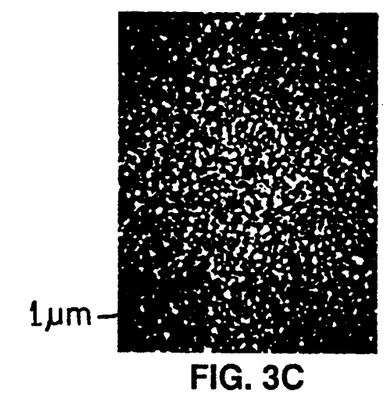
Figure 3D:
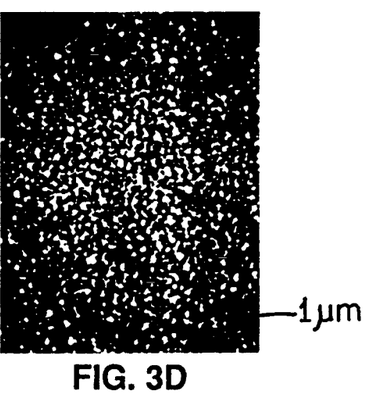
Figure 4:
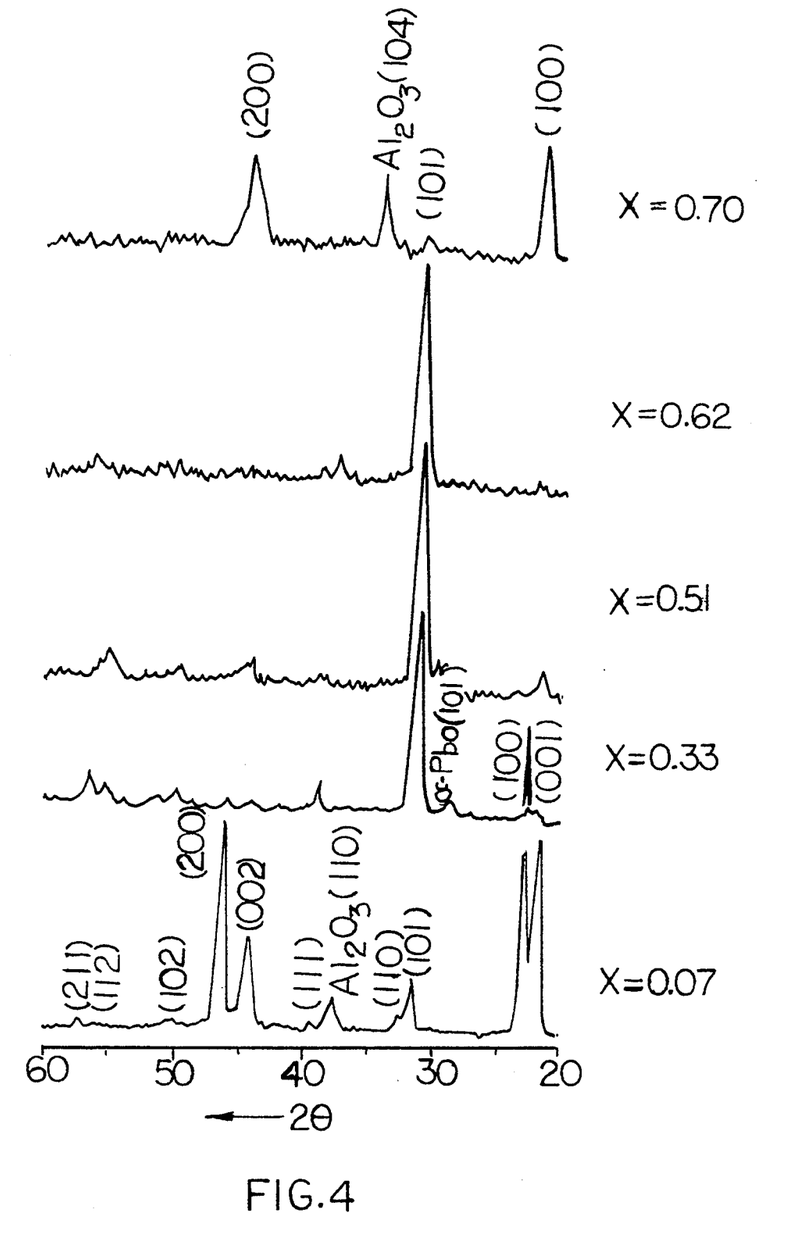
FIG. 4 is x-ray diffraction patterns of as-deposited PZT films on sapphire substrate.
Figure 5:
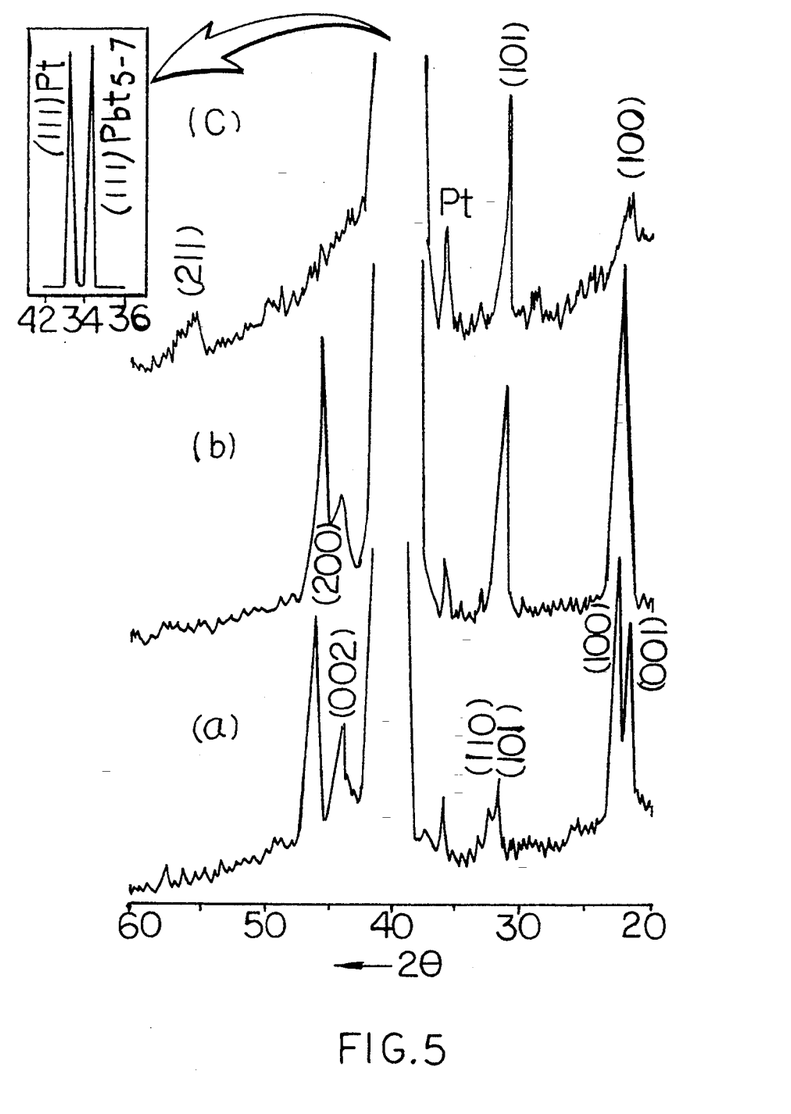
FIG. 5 is x-ray diffraction patterns of as-deposited PZT films on Pt/Ti/SiO$_2$/Si substrate.
Figure 6:
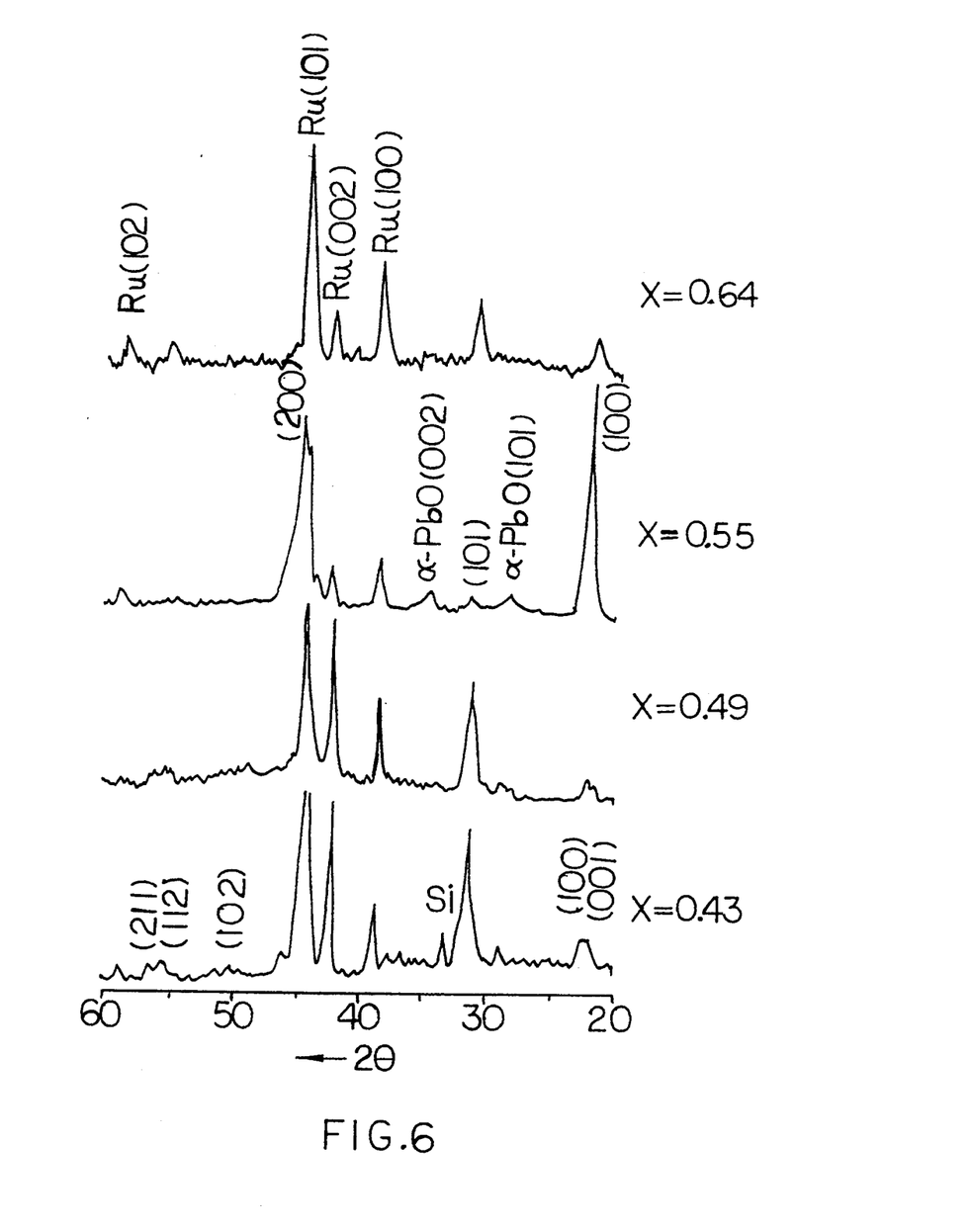
FIG. 6 is x-ray diffraction patterns of as-deposited PZT films on RuO$_x$/SiO$_2$/Si substrate.

The film growth rates ranged from 3.0 to 20.0 nm/min under the above deposition condition. As-deposited MOCVD PZT films were specular, crack-free, uniform, and adhered well on all substrates used and were highly transparent on sapphire substrates. The surface morphology of the typical MOCVD PZT films was investigated by SEM and is shown in FIG. 3. FIGS. 3(a)–(c) are the as-deposited films on sapphire disk with x=0.4, on Pt-coated substrate with x=0.6, and on $RuO_x$-coated substrate with x=0.8, respectively. FIG. 3(d) is the same sample as in FIG. 3(c) after annealing in air at 650° C. for 30 min. The SEM micrographs show that the films were dense and smooth on all three different substrates used. The grains were very fine and uniformly distributed. The average grain size was estimated to be 0.15 $\mu$m for the film on $Pt/Ti/SiO_2Si$ and $RuO_x/SiO_2/Si$ substrates and less than 0.1 $\mu$m for the film on the sapphire substrate. The x-ray diffraction patterns of the as-deposited PZT films on sapphire disks, $Pt/Ti/SiO_2/Si$ wafers, and $RuO_x/SiO_2/Si$ wafers are shown in FIGS. 4–6, respectively. All the as-deposited PZT films were single phase with perovskite structure, regardless of the substrate and the composition as can be seen in FIGS. 4–6.

Figure 7:
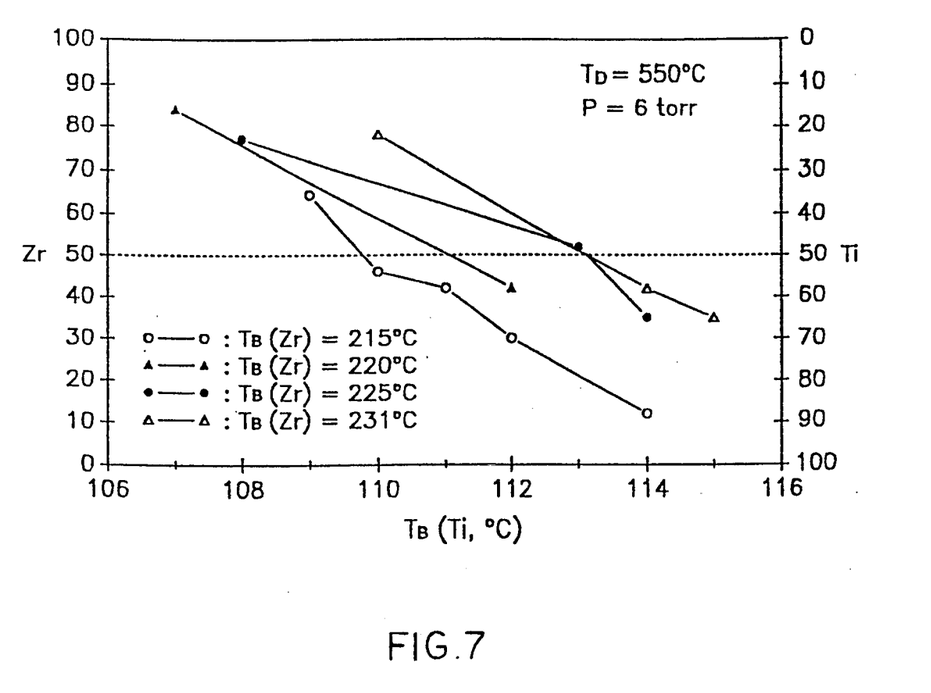
FIG. 7 is variation of (Zr,Ti) composition with the bubbler temperature of Zr and Ti precursors.

The stoichiometry of the films can be controlled mainly by varying the individual precursor temperatures and/or the diluent gas flow rates. The variation of the Zr/Ti ratio under different deposition conditions is illustrated in FIG. 7. As can be seen from FIG. 7, the desired Zr/Ti ratio can be easily obtained across the entire PZT solid solution range.

Figure 8:
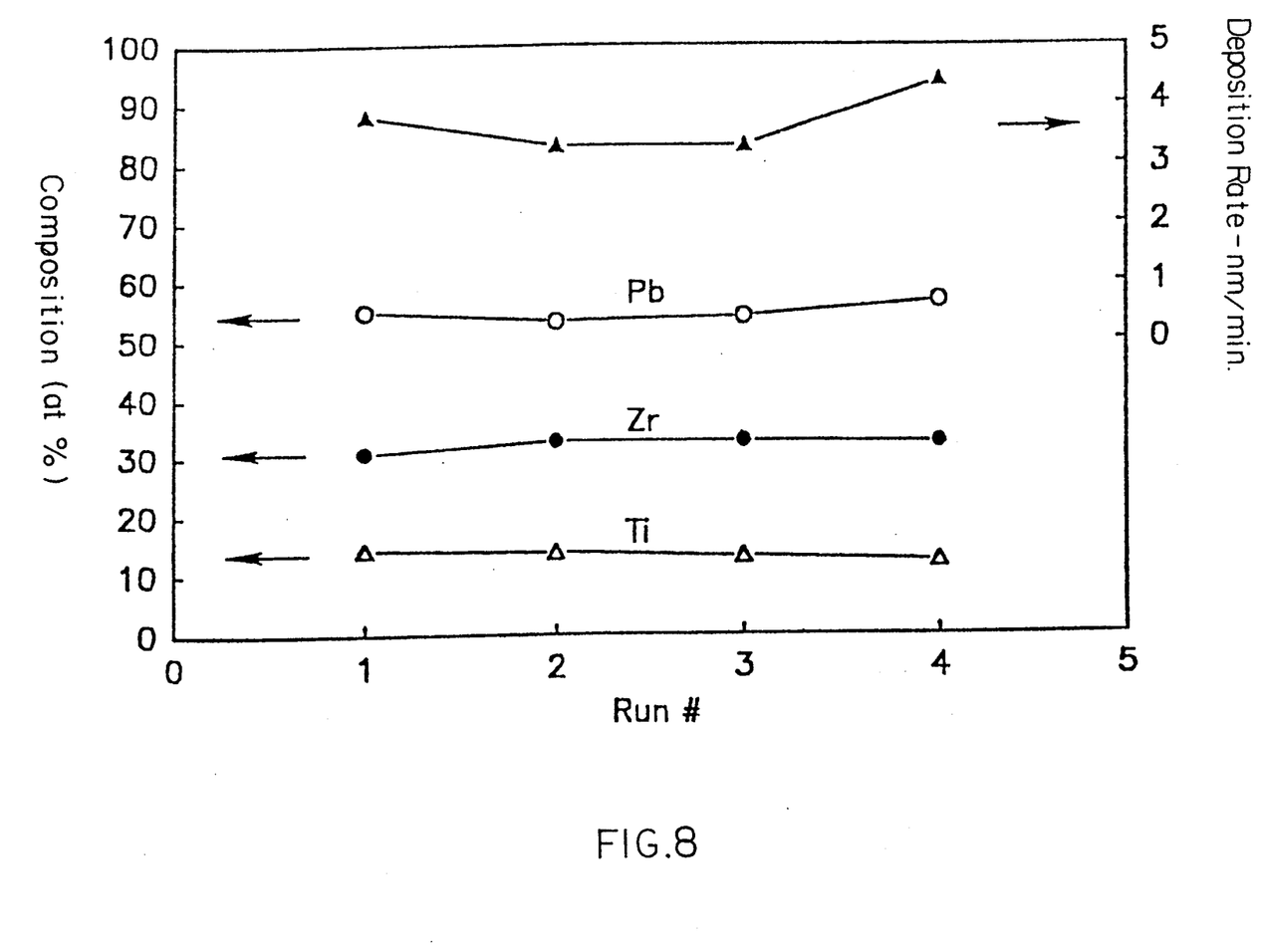
FIG. 8 is reproducibility of composition and deposition rate of PZT films on sapphire substrates for four consecutive runs with the same deposition condition.
Figure 9:
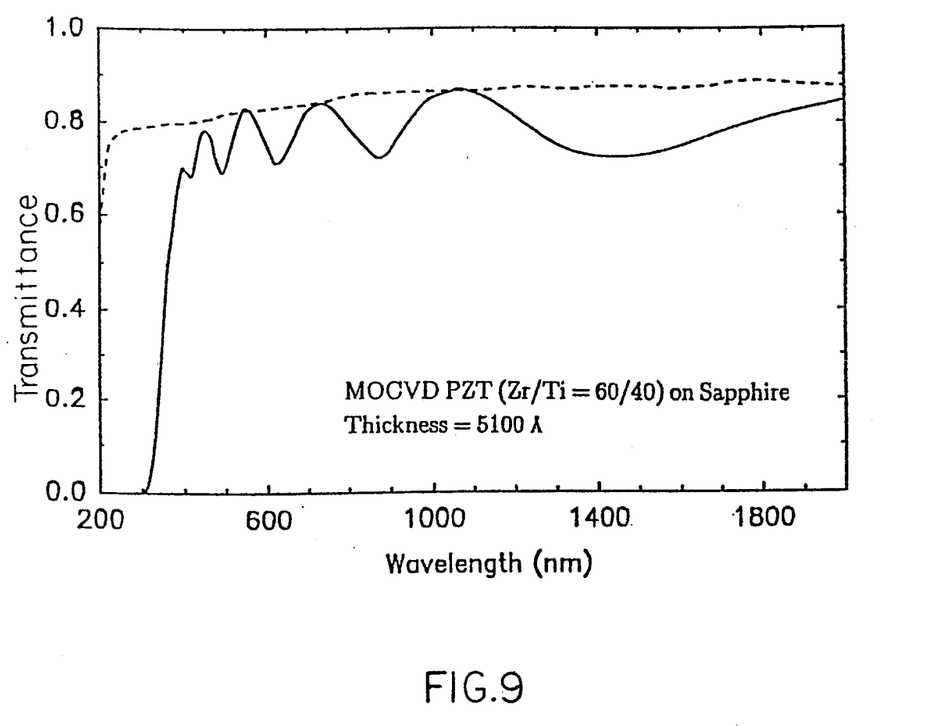
FIG. 9 is optical transmission spectrum of as-deposited MOCVD $Pb(Zr_{0.6}Ti_{0.4})O_3$ film on sapphire. Dashed line shows the transmittance of the uncoated sapphire substrate.
Figure 10:
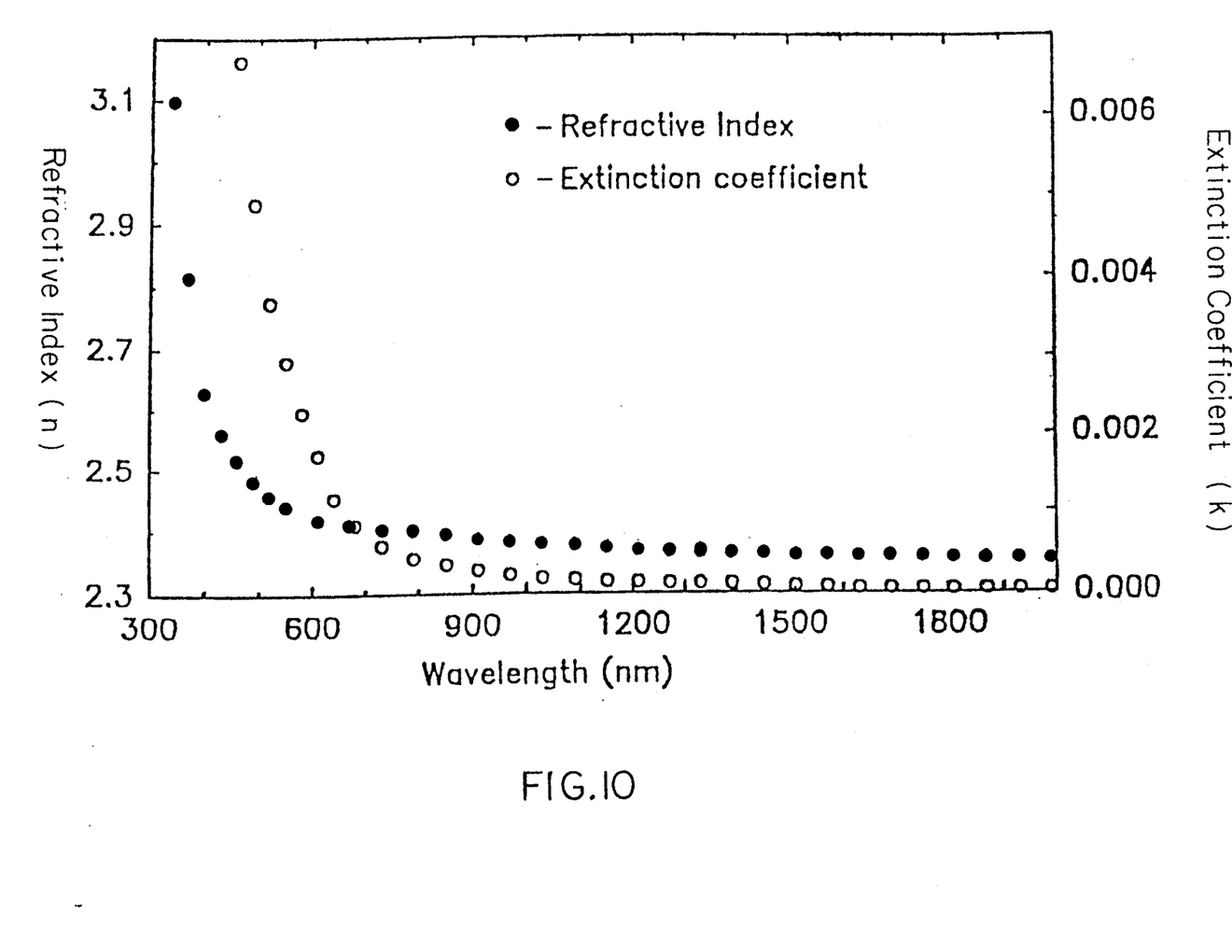
FIG. 10 is variation of optical constants with wavelength for as-deposited MOCVD $Pb(Zr_{0.6}Ti_{0.4})O_3$ film.

The reproducibility is always the most important issue from the view of mass production. FIG. 8 shows the reproducibility of the compositions and deposition rates of MOCVD PZT films on sapphire substrates for four consecutive runs with the same deposition parameters. The samples were picked from the same position in the reactor for each run. As can be seen in FIG. 10, the composition concentrations of Pb, Zr, and Ti were almost constant: $54\pm2$, $32\pm1$, and $14\pm1$ atomic %, respectively, for all four runs. In addition, the variation in the deposition rate was also small, $3.8\pm0.5$ nm/min. The UV-VIS-NIR transmission spectrum of the as-deposited PZT (x=0.6) film on the sapphire substrate is shown in FIG. 9. This spectrum illustrates that the transmittance drops down to 0% (the absorption edge) at a wavelength around 302 nm and has a value of 85% at a wavelength of 2000 nm. The n and k as a function of wavelength are shown in FIG. 10. The n and k values are 2.413 and 0.0008, respectively at $\lambda=632.8$ nm for the film with Zr/Ti=60/40. The high refractive index value, compared to the value of 2.281 from MOD PZT films, see Peng et al., "Optical properties of PZT, PLZT, and PNZT thin films," *Mat. Res. Soc. Symp. Proc.*, 243, 21 (1992), indicates that the MOCVD PZT film is denser than the MOD film. The very low extinction coefficient illustrates the nature of the specular and highly transparent films.

Figure 11A:
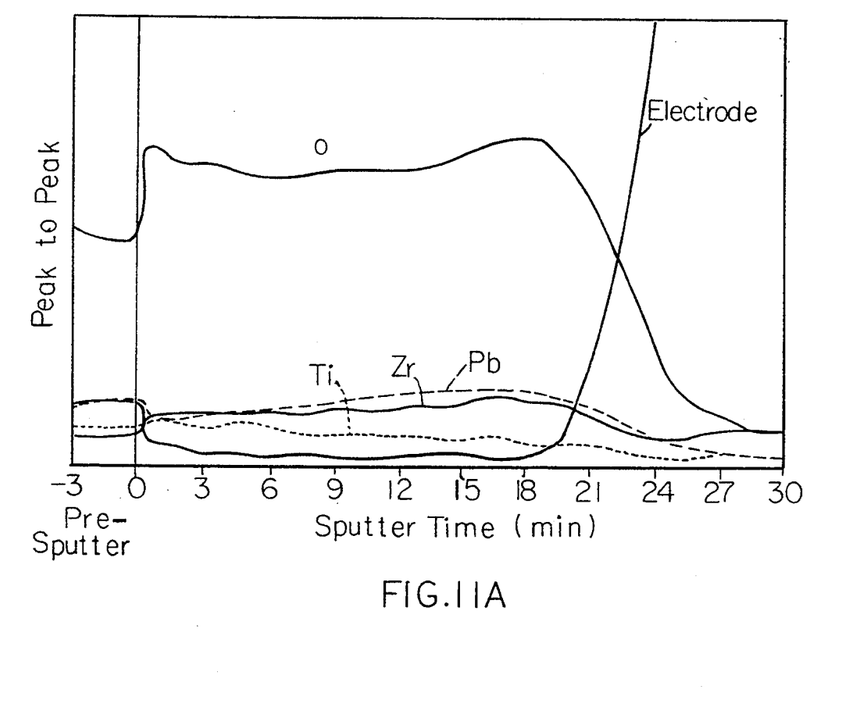
FIG. 11 is Auger electron spectroscopy study of MOCVD $Pb(Zr_{0.82}Ti_{0.18})O_3$ film: (A) composition depth profile, (B) AES spectrum on the sample surface, and (C) AES spectrum after 3 min. Ar sputtering.
Figure 11B:
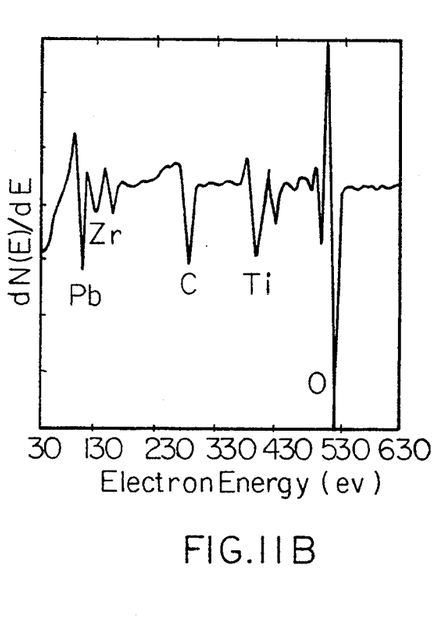
Figure 11C:
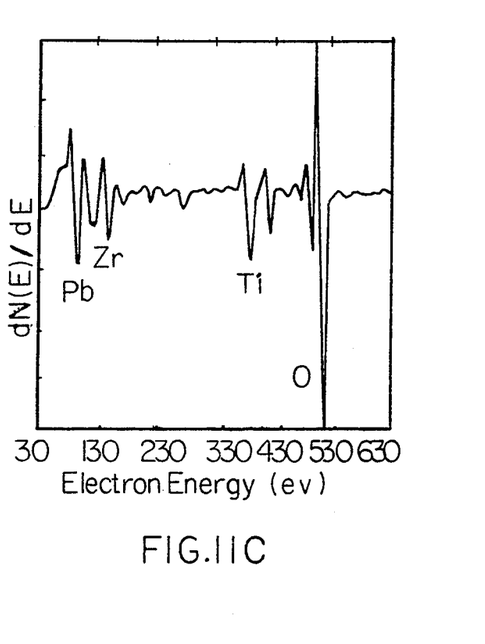
Figure 12:
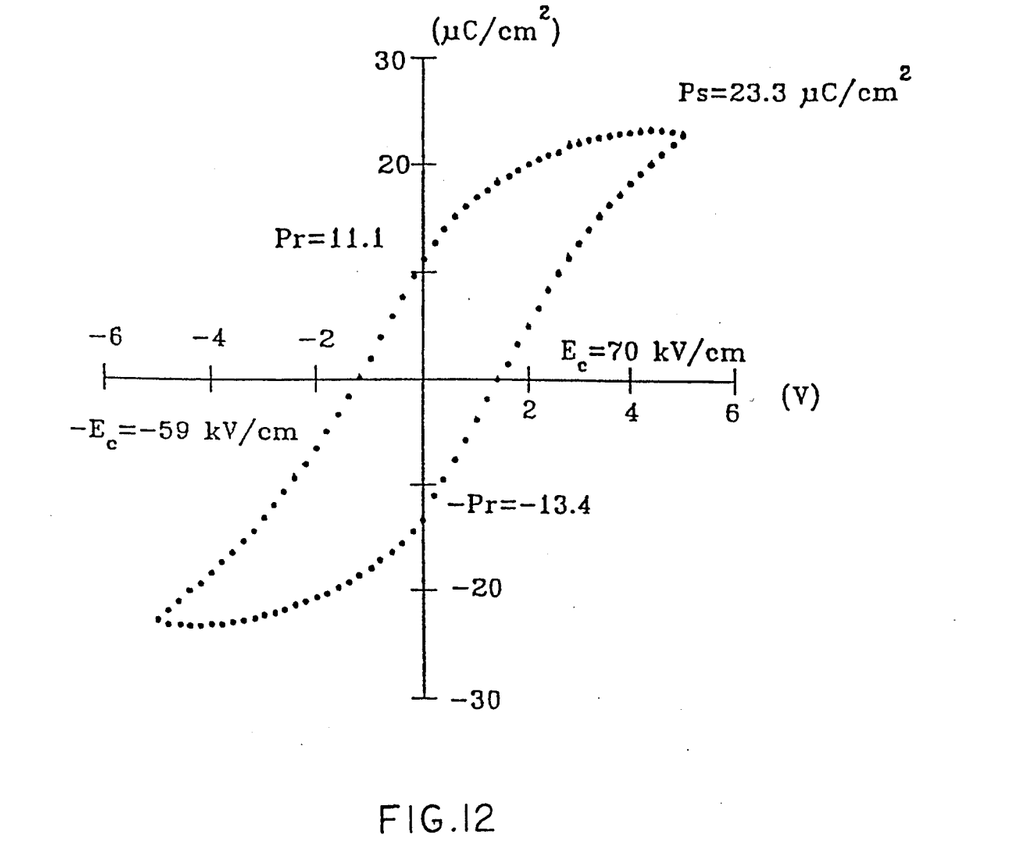
FIG. 12 is ferroelectric hysteresis loop of 600° C./30 min annealed MOCVD $Pb(Zr_{0.82}Ti_{0.18})O_3$ film.

FIG. 11 shows the Auger electron spectroscopy (AES) depth profile and selected AES spectra of the film with the composition of Pb/Zr/Ti=50/41/9. As can be seen in FIG. 11 (a), the composition was quite uniform through the balk of the film for all four elements i.e., Pb, Zr, Ti, and O. FIGS. 11(b) and 11 (c) show the AES spectra both at the sample surface and after 3 minutes of Ar sputtering, respectively. The carbon peak shown in FIG. 11 (b) was due to the carbon adsorption on the sample surface. After 3 minutes of Ar sputtering, the carbon peak was not detected as can be seen in FIG. 11(c). This indicates that no carbon contamination was found in the bulk of the film. The ferroelectric hysteresis loop of the corresponding sample is shown in FIG. 12. As can be seen in FIG. 12, this sample shows superior ferroelectric properties: the spontaneous polarization, $P_s=23.3$ $\mu C/cm^2$, the remanent polarization, $P_r=12.3$ $\mu C/cm^2$, and the coercive field, $E_c=64.5$ kV/cm.

EXAMPLE 2

The ferroelectric $Pb(Zr_xTi_{1-x})O_3$ thin films were deposited on sapphire disks, $Pt/Ti/SiO_2/Si$ wafers, and $RuO_x/SiO_2/Si$ wafers by a cold wall MOCVD reactor with the following parameters:

Substrate temperature: 600° C.

Precursor, precursor temperature, and carrier gas:
lead tetramethylheptadione, 145°–165° C., 20–30 sccm $N_2$
zirconium tetramethylheptadione, 200°–230° C., 15–30 sccm $N_2$
titanium ethoxide, 80°–115° C., 5 sccm $N_2$
Oxidizing agent: oxygen, 500–1000 sccm. Chamber pressure: 6 torr.

Figure 13:
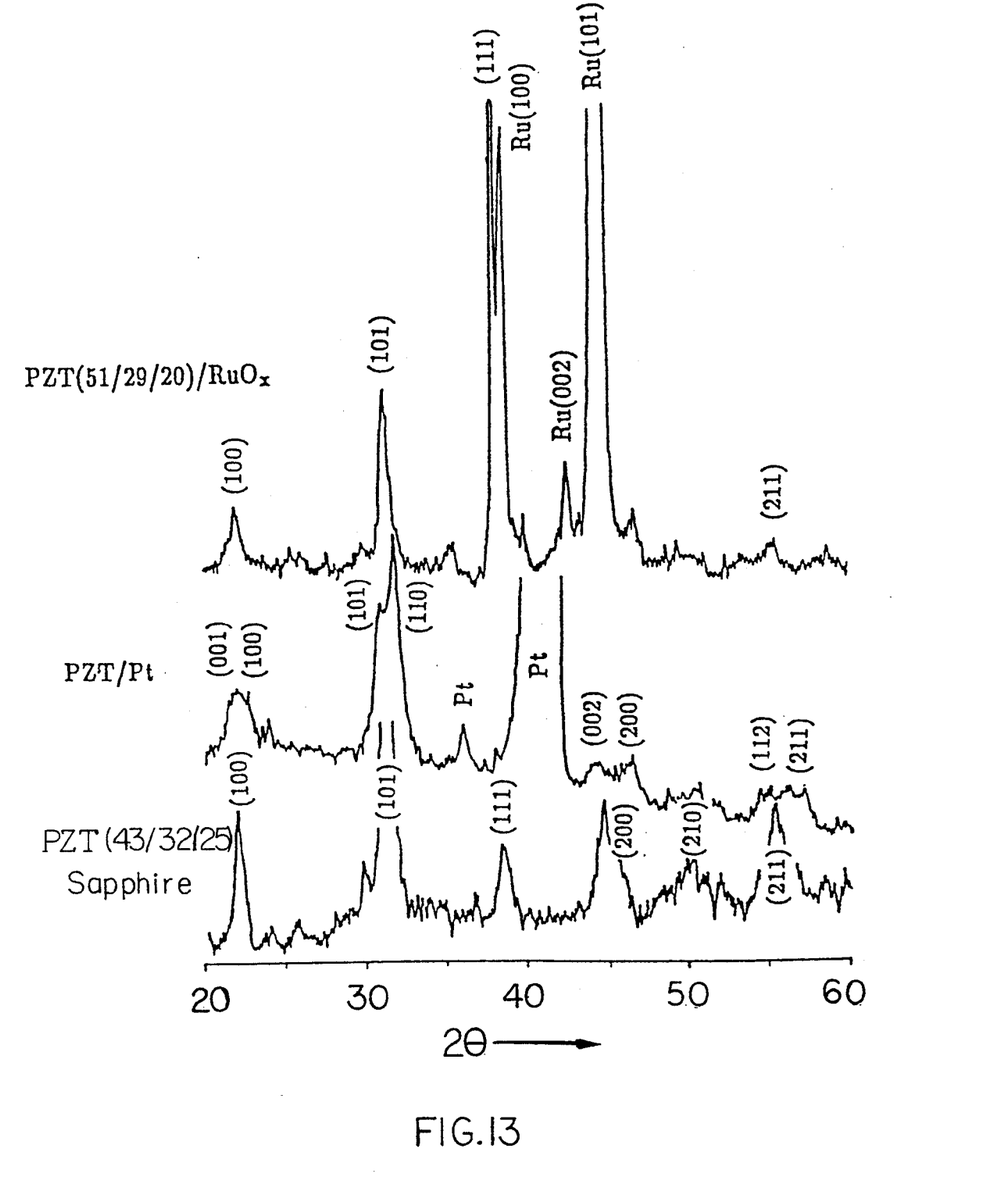
FIG. 13 is x-ray diffraction patterns of MOCVD PZT films deposited by cold-wall reactor at 600° C.

The deposition process of the cold-wall MOCVD PZT films was similar to that of hot-wall MOCVD PZT films as mentioned in EXAMPLE 1. The PZT films obtained from cold-wall MOCVD were also uniform and specular on all three different substrates, i.e. sapphire disks, Pt/Ti/SiO$_2$/Si, and RuO$_x$/SiO$_2$/Si substrates. Typical XRD patterns of the as-deposited PZT films by cold-wall MOCVD are shown in FIG. 13. The XRD patterns show that the films were single phase with perovskite structure.

What is claimed is:

1. A method of depositing ferroelectric lead zirconate titanate thin film with perovskite structure on a substrate by MOCVD, comprising the steps of:

maintaining said substrate at a pressure below about 100 torr in a CVD reactor;

heating said substrate in said CVD reactor;

transporting the vapors of precursors by a carrier gas and a oxidizing agent and/or a diluent gas into said CVD reactor for deposition on said substrate to form said ferroelectric lead zirconate titanate thin film with the perovskite structure wherein said precursors are lead tetramethylheptadione, zirconium tetramethylheptadione, and titanium ethoxide.

2. The method of claim 1 wherein said precursor temperature for lead tetramethylheptadione is about 140° to 165° C., for zirconium tetramethylheptadione is about 180° to 230° C., and for titanium ethoxide is about 80° C. 125° C.

3. The method of claim 1 wherein said oxidizing agent is at least one of oxygen and nitrous oxide.

4. The method of claim 3 wherein said oxidizing agent flow rate is about 300 to 2000 sccm, wherein the abbreviation sccm signifies standard cubic centimeter per minute.

5. The method of claim 1 wherein said carrier gas is at least one of nitrogen and inert gas.

6. The method of claim 5 wherein said lead tetramethylheptadione is carried by the carrier gas at about 10 to 50 sccm, zirconium tetramethylheptadione is carried by the carrier gas at about 10 to 50 sccm, and titanium ethoxide is carried by the carrier gas at about 1 to 10 sccm, wherein the abbreviation sccm signifies standard cubic centimeter per minute.

7. The method of claim 1 wherein said diluent gas is at least one of nitrogen and inert gas.

8. The method of claim 1 wherein said ferroelectric lead zirconate titanate thin film has a composition of Pb(Zr$_x$Ti$_{1-x}$)O$_3$ wherein x ranges from 0.0 to about 0.9.

9. The method of claim 1 wherein said ferroelectric lead zirconate titanate thin film deposited on said substrate has a composition of Pb(Zr$_{0.83}$Ti$_{0.18}$)O$_3$ with the ferroelectric properties of the spontaneous polarization of 23.3 $\mu$C/cm$^2$, the remanent polarization of 12.3 $\mu$C/cm$^2$, and the coercive field of 64.5 kV/cm.

* * * * *